United States Patent [19]
Erckert

[11] Patent Number: 6,100,742
[45] Date of Patent: Aug. 8, 2000

[54] DRIVER CIRCUIT FOR SLOPE-CONTROLLED PULSE SWITCHING OF A LOAD

[75] Inventor: Ricardo Erckert, Bad Aibling, Germany

[73] Assignee: STMicroelectronics GmbH, Grasbrunn, Germany

[21] Appl. No.: 09/008,194

[22] Filed: Jan. 15, 1998

[30] Foreign Application Priority Data

Jan. 16, 1997 [DE] Germany ............... 197 01 377

[51] Int. Cl.[7] ......................................... H03K 17/04
[52] U.S. Cl. ..................... 327/374; 327/379; 327/387
[58] Field of Search ............................ 327/108, 109, 327/110, 111, 112, 365, 374, 377, 379, 382, 387, 419, 427

[56] References Cited

U.S. PATENT DOCUMENTS

| | | | |
|---|---|---|---|
| 4,739,198 | 4/1988 | Maruyama | 307/530 |
| 5,469,094 | 11/1995 | Nessi | 327/110 |

FOREIGN PATENT DOCUMENTS 2 257 854   1/1993   United Kingdom ........... H03K 17/04

*Primary Examiner*—Jeffrey Zweizig
*Attorney, Agent, or Firm*—Theodore E. Galanthay; David V. Carlson; Seed and Berry LLP

[57] ABSTRACT

A driver circuit for slope-controlled pulsed switching of a load having a MOS switching transistor switching the load and a control loop with an amplifier having an amplifier input coupled with a switch control pulse source, an amplifier output connected with the gate of the MOS switching transistor, and a feedback capacitor. The driver circuit also includes a switchable current mirror circuit with a current mirror transistor formed by the MOS switching transistor and a diode transistor wired as a current mirror diode, a connection point between the diode transistor and the gate of the MOS switching transistor being connected with the amplifier output. A timer circuit is supplied on the input side with the switch control pulses from the switch control pulse source, and switches the diode transistor into a conductive state for essentially the duration of each switch control pulse edge and otherwise into a nonconductive state.

14 Claims, 5 Drawing Sheets

FIG. 4A VIN (Prior Art)

FIG. 4B Vds (Prior Art)

DRIVER CIRCUIT FOR SLOPE-CONTROLLED PULSE SWITCHING OF A LOAD

TECHNICAL FIELD

The present invention relates to a driver circuit for a slope-controlled pulsed switching of a load.

BACKGROUND OF THE INVENTION

For reducing electromagnetic interference from the operation of switch devices the rise and fall rates of turn-on and turn-off operations of the switch devices are controlled by means of a feedback control loop. Rise and fall rates of about 1 V/μs are handled conventionally without serious problems. For applications having a pulsed operation, as in stepping motor drivers, etc., rise and fall rates of about 10 V/μs to 30 V/μs are more suitable. At such rise and fall rates, however, stability of the control loop is more critical. This is due to nonlinearities of the control loop together with a propagation delay in the driver stages, which contribute considerably to a total phase lag of the control loop.

For applications in switch devices which do not require a narrow definition of the rise and fall rate, the drain-to-gate capacitance of a MOS transistor is used. The gate drive is current-limited to a few microamperes. Such simple circuits depend greatly on the manufacturing spread of the gate capacitance of the MOS transistor. In addition, the turn-on delay and the turn-off delay are quite long since the gate voltage rises and falls slowly during turn-on and turn-off by reason of the relatively small gate capacitance of the MOS transistor, even in voltage ranges which are far removed from the turn-on threshold of the MOS transistor.

Such a conventional driver circuit is shown in FIG. 3. ON, VCC and VS designate an input terminal pin, a first voltage supply pin and a second voltage supply pin of an integrated circuit, respectively.

A pulsed switch control signal supplied to ON passes to a driver DR1 and from two outputs of the driver DR1 to two power sources IQ1 and IQ2. The power sources IQ1 and IQ2 deliver current I1 and I2, respectively, in a turned-on state and usually involve a push-pull stage whose two stages are driven in opposition by the driver DR1. A first node SK1 connected between the power sources IQ1 and IQ2 is connected to a gate of a switching transistor M1 in the form of an N-channel MOS transistor. A drain terminal D of the switching transistor M1 is connected to a load $R_L$ which is disposed in series with the switching transistor M1. Between the first node SK1 and a second node SK2 between the drain terminal D of the switching transistor M1 and the load $R_L$ is connected a capacitor C1 which represents the Miller capacitance of the drain-to-gate capacitance of the switching transistor M1. The current I1 charges the capacitor C1 and the gate of the switching transistor M1 and the current I2 discharges the capacitor C1 and the gate of the switching transistor M1.

The speed at which an output voltage can be switched at the second node SK2 is limited by the gate charging current or gate discharge current of the switching transistor M1.

The fall rate of a trailing edge of the output voltage at the drain terminal D of the switching transistor M1 is $$dV/dt = -I1/C1 \tag{1}$$

The rise rate of a leading edge of the output voltage at drain terminal D of the switching transistor M1 is $$dV/dt = I2/C1 \tag{2}$$

Typically I1 and I2 are selected to be equal in order to obtain the same rise and fall rates for both edges of a voltage pulse. Unfortunately the drain-to-gate capacitance of a MOS transistor depends greatly on its gate-to-drain voltage. A typical pulse response of a driver circuit according to FIG. 3 is shown in FIG. 4. In FIG. 4(a) a switch control pulse VIN supplied to the input terminal pin ON is shown, while in FIG. 4(b) a pulse response of the driver circuit shown in FIG. 3 is shown, in the form of the drain-to-source voltage Vds of the switching transistor M1.

The pulse response in FIG. 4(b) shows, firstly, a turn-off delay t1 and a turn-on delay t3 which come from the gate-to-source capacitance of the switching transistor M1. Two time periods t2 and t4 show a leading edge and a trailing edge of the pulse response, respectively. During the time periods t2 and t4 the slope rate or rate of change of the pulse response is not constant and is subject to manufacturing tolerances.

To obtain more precisely defined edges and reduce the delays (t1 and t3 in FIG. 4(b)) a control loop may be used. A conventional driver circuit with such a control loop is shown in FIG. 5. This circuit is quite similar to the circuit shown in FIG. 3. In addition to the circuit elements according to FIG. 3, the driver circuit shown in FIG. 5 has an amplifier AMP and a feedback capacitor C2. In this circuit, the slope rate is defined by the currents I1 (trailing edge) and I2 (leading edge) and the capacitor C2. The output of amplifier AMP is of sufficiently low resistance to charge and discharge the gate of the switching transistor M1, whereby the highest possible gate-to-drain capacitance C1 found in the operating range of the switching transistor M1 is assumed. The amplifier delivers so much output current that the capacitor C1 can be recharged much faster than the capacitor C2. This virtually eliminates the delay times t1 and t3 in FIG. 4(b). In addition, the feedback capacitor C2 can be well defined since it is less dependent on manufacturing spreads than the capacitor C1.

Considering a turn-on operation, the gate-to-source capacitance of the switching transistor M1 (not shown) is charged with the maximum current which the amplifier AMP can deliver. The turn-on delay (t3 in FIG. 4(b)) can therefore be reduced by orders of magnitude. When the gate-to-source voltage approaches the turn-on threshold voltage of the switching transistor M1, the drain voltage decreases, which leads to a discharge of the capacitor C2. After the switching transistor M1 is turned on, the on resistance of the switching transistor M1 decreases much faster than in the circuit shown in FIG. 3.

The driver circuit of FIG. 5 contains a complete control loop. The control loop must be designed so that it remains stable at the maximum gain of the amplifier AMP and for the maximum steepness of the switching transistor M1, which acts as a second amplifier stage together with the load $R_L$. The steepness of the switching transistor M1 depends greatly on its operating point. The control loop gain increases with the load current (for inductive loads). For the control loop to remain stable, it must have enough phase latitude to maintain its stability even at the maximum working current of the switching transistor M1. At the same time, the control loop gain must be high enough to permit a suitable slope control for low load currents. Assuming a working current range of 100 mA to 1 A for the switching transistor M1 for example, the control loop gain changes by one order of magnitude.

With conventional methods, stability can be obtained for slope rates up to about 1 V/μs. The dominant pole is usually defined by the gate capacitance of the switching transistor M1 together with the output impedance of driver amplifier AMP. For this stabilizing approach, the phase shift must be less than π/4 through the amplifier AMP at the highest frequency at which the control loop gain exceeds 1 (for an overshoot of 5%).

SUMMARY OF THE INVENTION

According to principles of the present invention, a driver circuit is provided to obtain higher slope rates (e.g. 30 V/μs) in a switching transistor with an output impedance of an amplifier which is reduced. This causes a dominant pole of a control loop of the driver circuit to shift toward higher frequencies. This increases the influence of the stability-threatening propagation times of the amplifier (second-order poles) so far that stability is no longer ensured over the entire nonlinear working range, in particular for high gate voltages of the switching transistor.

The driver circuit according to principles of the present invention has improved stability of the slope control.

One feature of the invention is that it includes a slope control loop which is linearized temporarily, namely for the duration of a leading or trailing edge.

For this purpose the driver circuit according to principles of the present invention has a switchable current mirror circuit which is switched to current mirror operation during time periods which are preset by a timer circuit and essentially match the times of the leading or trailing edges, and whose current mirror operation is switched off outside the slope times. During current mirror operation, the output of the amplifier is loaded so greatly by the current mirror that the control loop is linearized.

BRIEF DESCRIPTION OF THE DRAWINGS

The invention will now be explained more closely with reference to an embodiment of the present invention. In the enclosed drawings.

DETAILED DESCRIPTION OF THE INVENTION

Figure 1:
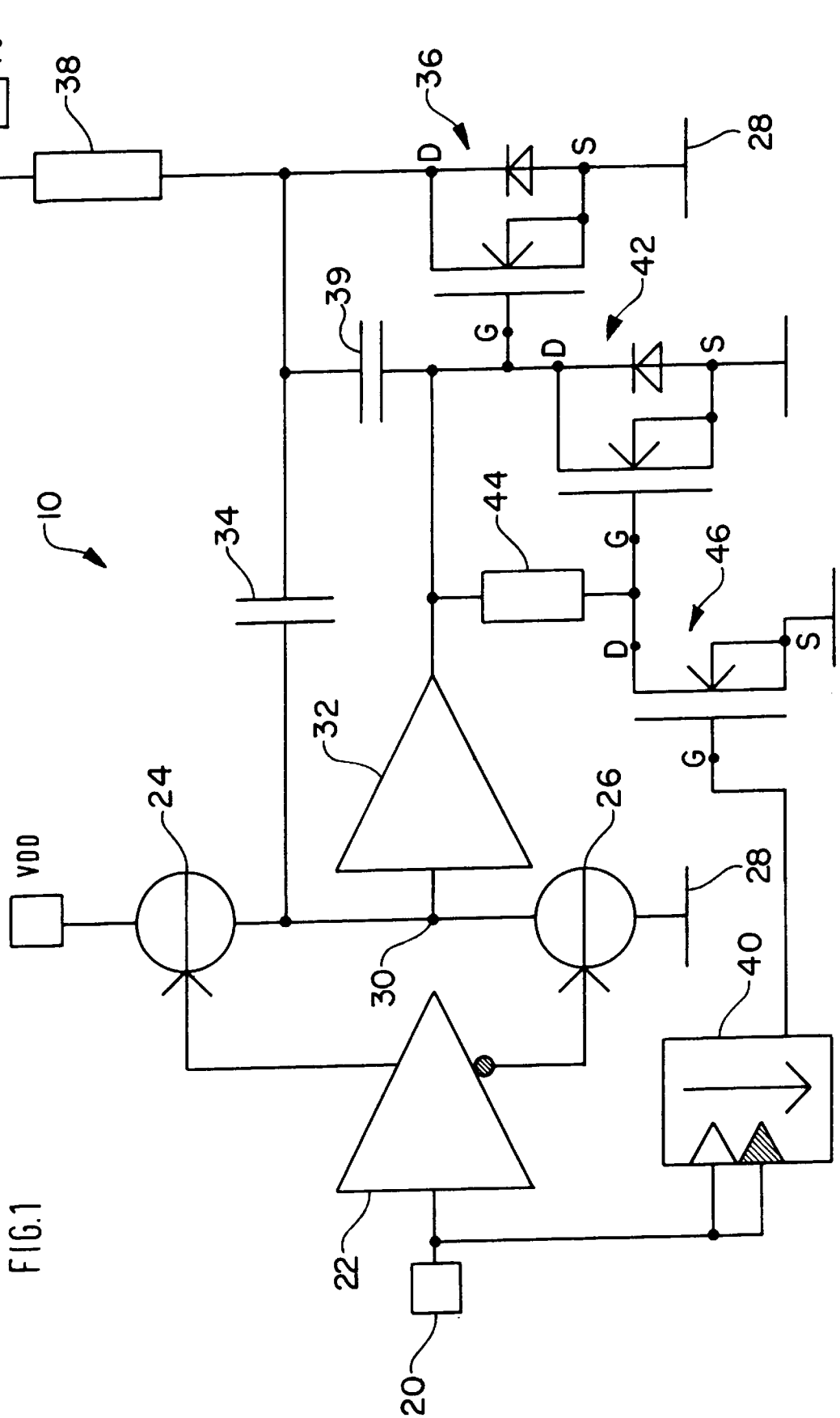
FIG. 1 shows a driver circuit according to the embodiment of the present invention.
Figure 5:
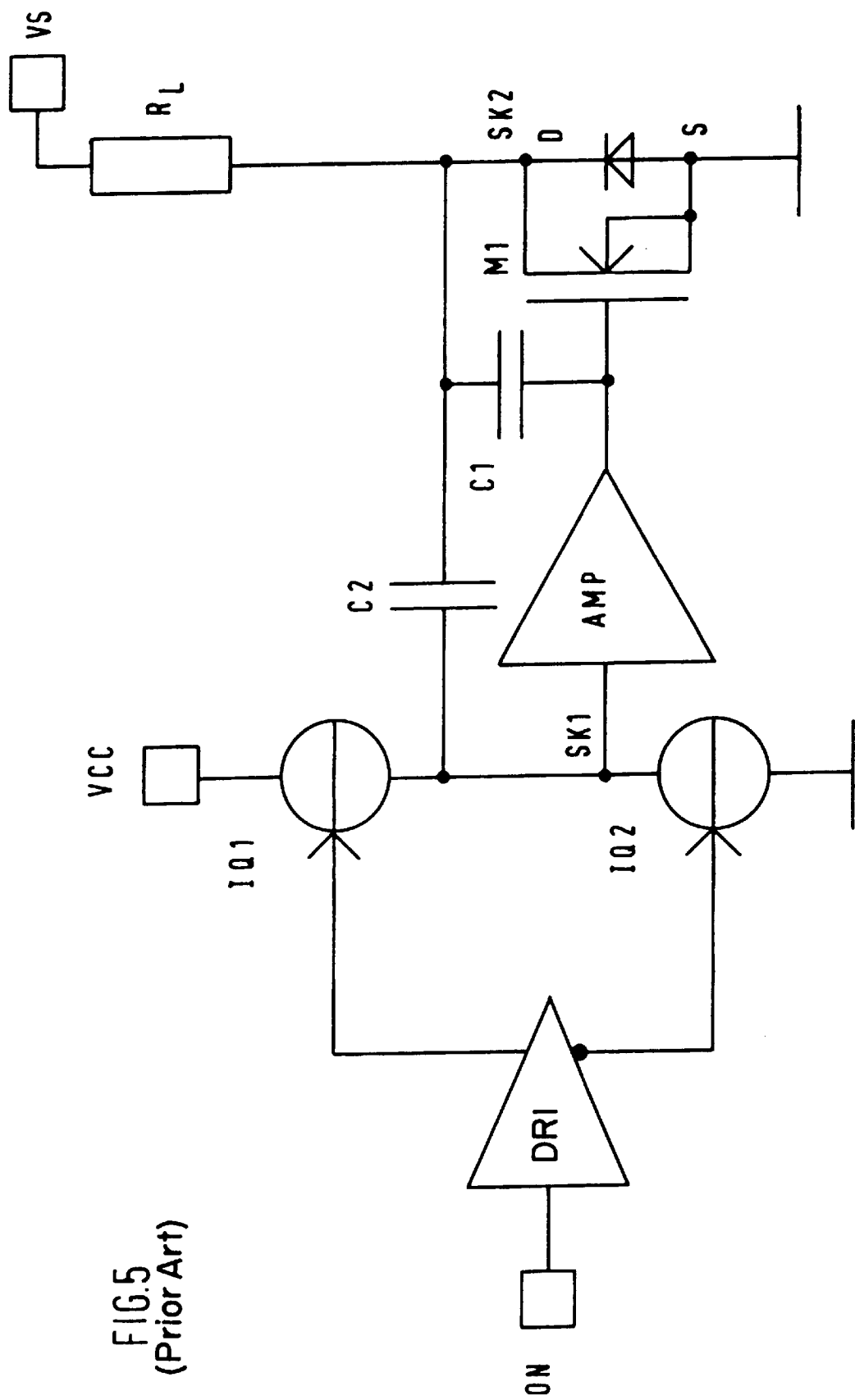
FIG. 5 shows a second conventional driver circuit.

A driver circuit 10 according to an embodiment of the present invention is shown in FIG. 1. The driver circuit 10 includes an input terminal pin 20 connected to an input of a driver 22. A non-inverting output of the driver 22 is connected to an input of a first power source 24, and an inverting output of the driver 22 is connected to an input of a second power source 26. The first power source 24 receives a supply voltage VDD, and the second power source 26 is connected to a ground 28. The first and second power sources 24 and 26 each have outputs connected together at a node 30 which is connected to an input of an amplifier 32. The node 30 is also connected to a first plate of a feedback capacitor 34, and a second plate of the feedback capacitor 34 is connected to a drain D of a first switching transistor 36. The first power source 24 provides a first current to the feedback capacitor 34 and the second power source 26 draws a second current from the feedback capacitor 34 based on signals from the driver 22. The first switching transistor 36 is an N-channel MOS transistor. The drain D of the first switching transistor 36 is also connected to a first end of a load 38, and a second end of the load 38 is connected to a supply voltage VS. A source S of the first switching transistor 36 is connected to the ground 28. The drain D of the first switching transistor 36 is also connected to a first plate of a drain-to-gate capacitor 39, and a second plate of the drain-to-gate capacitor 39 is connected to a gate G of the first switching transistor 36 and to an output of the amplifier 32. The drain-to-gate capacitor 39 represents the Miller capacitance of the first switching transistor 36. The driver circuit 10 includes many elements similar to those in the driver circuit shown in FIG. 5, and such similar elements operate in a similar manner.

The driver circuit 10 includes a monostable circuit 40 acting as a timer circuit, a diode transistor 42 wired as a diode via a resistor 44 and forming a current mirror circuit together with the first switching transistor 36, and a second switching transistor 46 has a gate G connected to an output of the monostable circuit 40 and a drain D connected to a gate G of the diode transistor 42. The monostable circuit 40 has two inputs connected together to the input terminal pin 20. The exact circuitry is shown in FIG. 1.

The monostable circuit 40 is triggered both by leading edges and by trailing edges of a pulsed switch control signal supplied to the input terminal pin 20, to release an output pulse of defined duration. This causes the second switching transistor 46 to be rendered nonconductive during a period corresponding essentially to a slope time of a voltage at the drain D of the first switching transistor 36 initiated by a change in the switch control signal, thereby rendering the diode transistor 42 conductive so that the resistor 44 and the diode transistor 42 act as a MOS diode. In this turn-on state of the diode transistor 42, the transistors 36 and 42 act as a current mirror which produces a load current independent of a loop gain of the driver circuit 10. The loop control itself is performed, as in the case of the driver circuit shown in FIG. 5, by means of the feedback capacitor 34, the amplifier 32 and the first and second power sources 24 and 26.

Outside the times when the monostable circuit 40 is in the triggered state, the second switching transistor 46 is conductive so that the diode transistor 42 is nonconductive and the current mirror loading for the output of the amplifier 32 is eliminated. Since the diode transistor 42 is nonconductive, the first switching transistor 36 receives a higher gate-to-source voltage so that it passes into a more conductive state in which it has a smaller forward resistance $R_{DS\ ON}$.

Using the driver circuit 10 shown in FIG. 1 it is possible to optimize the frequency characteristic of the slope control for an exactly defined loop gain (which can be fixed by a channel width ratios of the diode transistor 42 and the first switching transistor 36). This permits an optimization of the slope control for applications with higher switching speed, necessitating slope rates up to 20 V/μs or more.

The measures of the inventive driver circuit 10 thus obtain both a stabilization of the control loop during the switching pulse edges and a low forward resistance of the first switching transistor 36 between the switching pulse edges.

Figure 2:
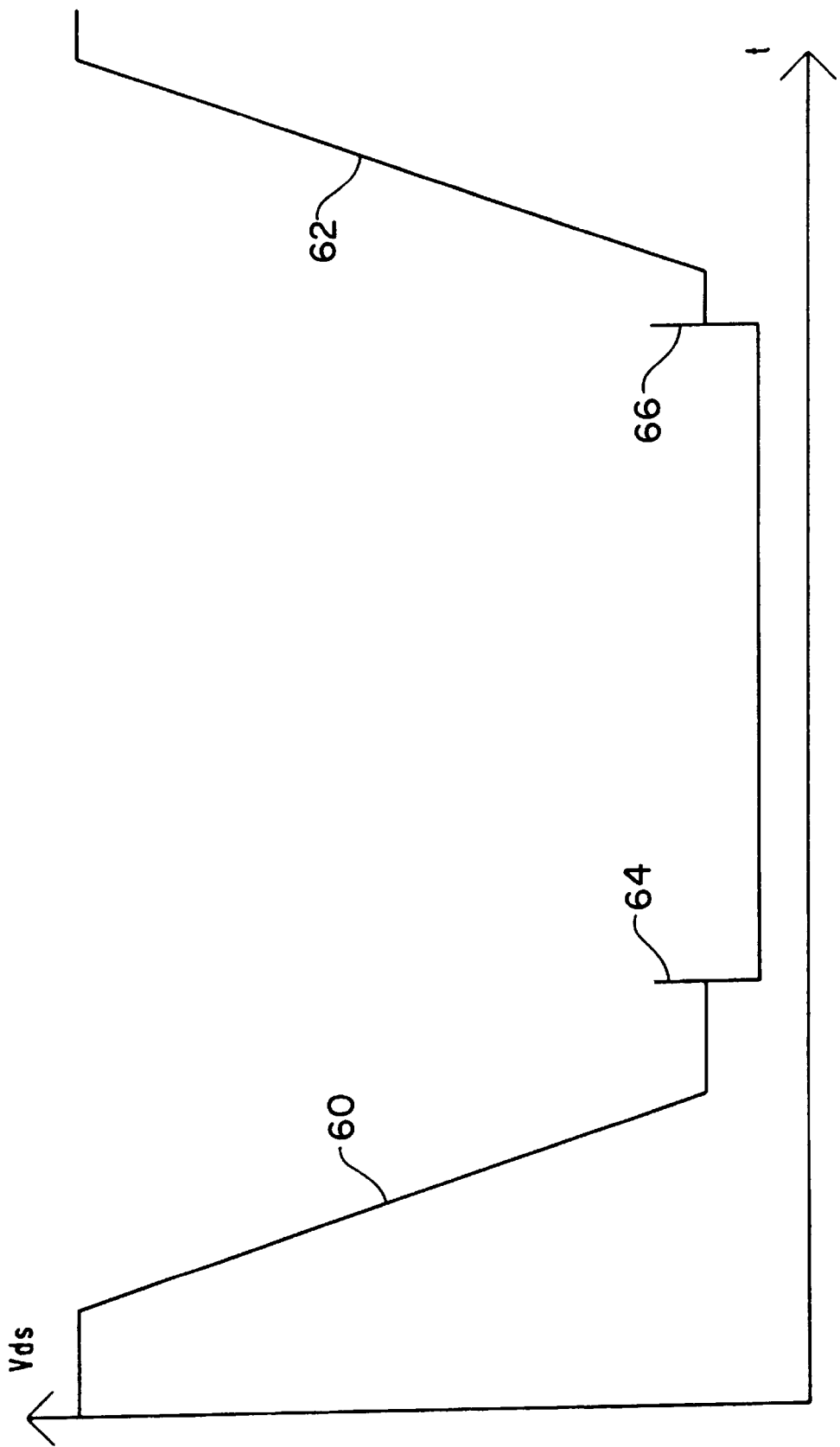
FIG. 2 shows in schematized fashion a switching characteristic of the driver circuit shown in FIG. 1.
Figure 3:
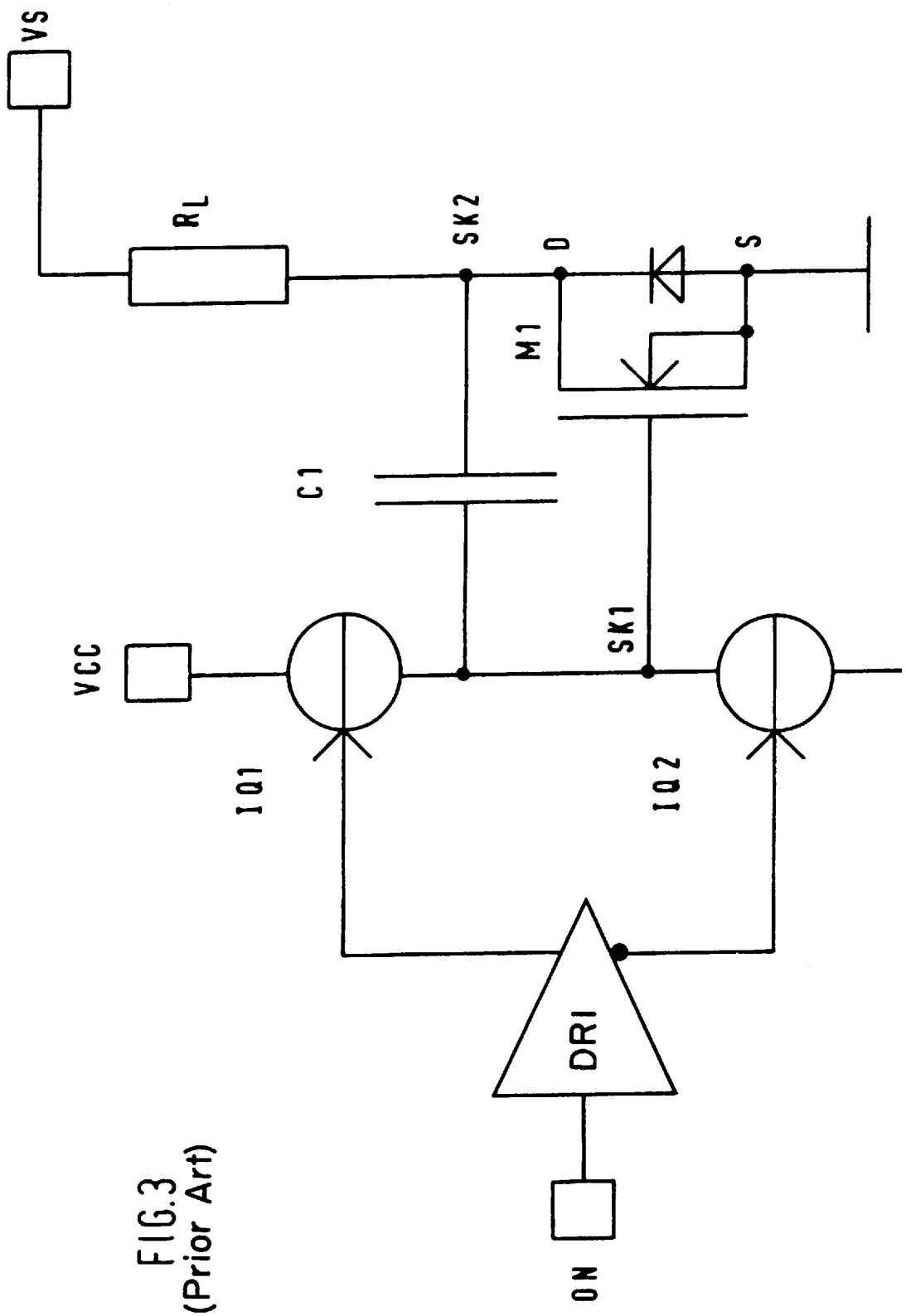
FIG. 3 shows a conventional driver circuit.
Figure 4:
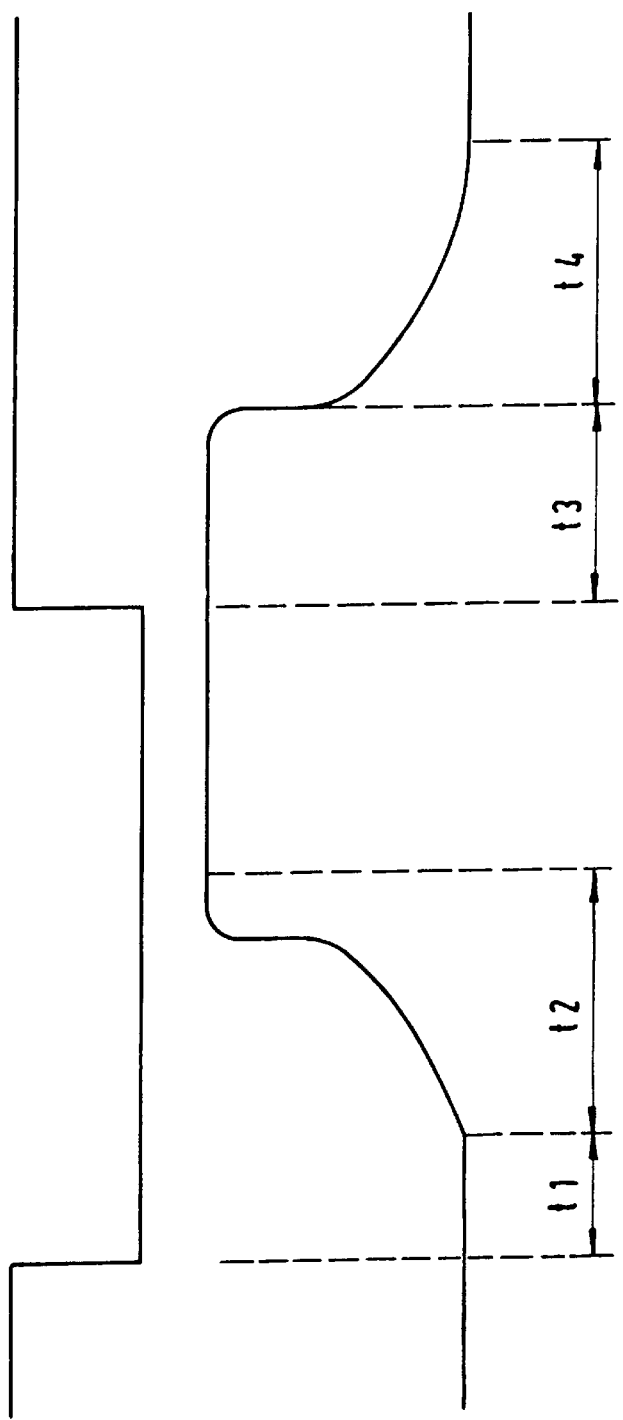
FIG. 4(a) shows a switch control pulse applied to an input terminal pin of the conventional driver circuit of FIG. 3.
FIG. 4(b) shows a pulse response of the conventional driver circuit of FIG. 3.

FIG. 2 shows a voltage curve over the drain-to-source distance of the first switching transistor 36, plotting the drain-to-source voltage Vds as a function of time.

During the pulse edges 60 and 62, or, more exactly, during the times when the monostable circuit 40 is triggered, the second switching transistor 46 is turned off so that the trailing edge 60 and the leading edge 62 of the particular switching pulse have a steadily controlled slope rate. As FIG. 2 shows, Vds is lower during the turn-on time of the second switching transistor 46 between the pulse edges 60 and 62, and more particularly between the points 64 and 66, than when the second switching transistor 46 is nonconductive. Thus the forward resistance of the first switching transistor 36 is lower during the turn-on time of the second switch transistor 46 than when the second switch transistor 46 is nonconductive.

Related circuits are described in detail in the following applications which are commonly owned: the application entitled "ELECTRIC CIRCUIT ARRANGEMENT COMPRISING A SWITCHABLE FEEDBACK BRANCH," U.S. patent application Ser. No. 08/994,791, claiming priority based on German Application No. 196 53 191.8, filed Dec. 19, 1996; the application entitled "ANALOG-SIGNAL TO SQUARE-WAVE-SIGNAL RESHAPING SYSTEM WITH OFFSET COMPENSATION," U.S. patent application Ser. No. 08/994,073, claiming priority based on German Application No. 196 53 189.6, filed Dec. 19, 1996; and the application entitled "MONOLITHICALLY INTEGRATED SIGNAL PROCESSING CIRCUIT," U.S. patent application Ser. No. 08/989,442, claiming priority based on German Application No. 196 53 192.6, filed on Dec. 19, 1996.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A driver circuit for controlling current in a load comprising:
    a switching transistor coupled to the load, the switching transistor having a control terminal;
    a control circuit coupled to the control terminal of the switching transistor, the control circuit being structured to provide a control signal having leading edges and trailing edges to the control terminal of the switching transistor, wherein the control circuit comprises:
        an amplifier having an input and an output coupled to the control terminal of the switching transistor;
        a feedback capacitor coupled between the input of the amplifier and a terminal of the switching transistor; and
        an input terminal coupled to receive a switch control signal having leading edges and trailing edges; and
    a current circuit coupled to the control circuit to draw current from the control circuit during each leading edge and each trailing edge of the control signal, wherein the current circuit comprises:
        a first transistor coupled to the control terminal of the switching transistor, the first transistor having a control terminal coupled to receive a signal to enable the first transistor to draw current from the control terminal of the switching transistor during each leading edge and each trailing edge of the switch control signal;
        a monostable circuit having an input coupled to the input terminal to receive the switch control signal and an output coupled to the control terminal of the first transistor, the monostable circuit being structured to enable the first transistor during the leading edges and the trailing edges of the switch control signal; and
        a second transistor having a control terminal coupled to the output of the monostable circuit, a first terminal coupled to the control terminal of the first transistor, and a second terminal coupled to a ground, the second transistor being structured to be disabled by the monostable circuit during the leading edges and the trailing edges of the switch control signal to enable the first transistor.

2. The driver circuit of claim 1 wherein the switching transistor comprises an N-channel MOS transistor having a drain terminal coupled to the load and a source terminal coupled to the ground.

3. The driver circuit of claim 1 wherein the control circuit further comprises:
    an input circuit having an input connected to the input terminal to receive the switch control signal;
    a first current source coupled to a non-inverting output of the input circuit to receive the switch control signals and having an output coupled to the input of the amplifier, the first current source being structured to provide a first current to the input of the amplifier based on the switch control signal; and
    a second current source coupled to an inverting output of the input circuit to receive an inverted switch control signal and having an output coupled to the input of the amplifier, the second current source being structured to draw a second current from the input of the amplifier based on the inverted switch control signal.

4. A driver circuit for a slope-controlled pulsed switching of a load, the driver circuit comprising:
    a switching transistor coupled to the load and structured to switch the load;
    a control loop with an amplifier having an amplifier input coupled with a switch control pulse source, an amplifier output connected with a control terminal of the switching transistor, and a feedback capacitor;
    a switchable current mirror circuit with a current mirror transistor formed by the switching transistor, and a diode transistor wired as a current mirror diode, a connection point between the diode transistor and the control terminal of the switching transistor being connected to the amplifier output;
    a timer circuit coupled to receive at an input side a plurality of switch control pulses having rising edges and trailing edges from the switch control pulse source, the timer circuit having an output and being structured to switch the diode transistor into a conductive state for a duration of each rising and trailing edge and otherwise into a nonconductive state; and
    a drive transistor coupled between the output of the timer circuit and a control terminal of the diode transistor.

5. The driver circuit of claim 4, further comprising a resistor coupled between the amplifier output and the control terminal of the diode transistor.

6. The driver circuit of claim 5 wherein the timer circuit has a monostable circuit adapted to be triggered both by the rising edges and by the trailing edges of the switch control pulses, the monostable circuit being structured to generate an output signal rendering the diode transistor conductive during a stay in a temporarily stable state and rendering the diode transistor nonconductive during a stay in a permanently stable state.

7. The driver circuit of claim 4 wherein the diode transistor, the switching transistor, and the drive transistor are formed as MOS transistors.

8. The driver circuit of claim 7 wherein the amplifier input is connected with an output of a push-pull circuit adapted to be driven by a driver stage coupled to the switch control pulse source.

9. The driver circuit of claim 8 wherein the switching transistor is connected in series with the load, the load being connected between a voltage supply connection and the switching transistor; and wherein the switching transistor is formed as an N-channel MOS transistor.

10. The driver circuit of claim 9 wherein the diode transistor and the drive transistor are formed as N-channel MOS transistors.

11. A driver circuit for controlling current in a load comprising:

a switching transistor coupled to the load, the switching transistor having a control terminal;

a control circuit coupled to the control terminal of the switching transistor, the control circuit being structured to provide a control signal having leading edges and trailing edges to the control terminal of the switching transistor, wherein the control circuit comprises:

an amplifier having an input and an output coupled to the control terminal of the switching transistor;

a feedback capacitor coupled between the input of the amplifier and a terminal of the switching transistor;

an input terminal coupled to receive a switch control signal having leading edges and trailing edges;

an input circuit having an input connected to the input terminal to receive the switch control signal;

a first current source coupled to a non-inverting output of the input circuit to receive the switch control signals and having an output coupled to the input of the amplifier, the first current source being structured to provide a first current to the input of the amplifier based on the switch control signal; and a second current source coupled to an inverting output of the input circuit to receive an inverted switch control signal and having an output coupled to the input of the amplifier, the second current source being structured to draw a second current from the input of the amplifier based on the inverted switch control signal; and a current circuit coupled to the control circuit to draw current from the control circuit during each leading edge and each trailing edge of the control signal, wherein the current circuit comprises a first transistor coupled to the control terminal of the switching transistor, the first transistor having a control terminal coupled to receive a signal to enable the first transistor to draw current from the control terminal of the switching transistor during each leading edge and each trailing edge of the switch control signal.

12. The driver circuit of claim 11 wherein the current circuit further comprises a monostable circuit having an input coupled to the input terminal to receive the switch control signal and an output coupled to the control terminal of the first transistor, the first transistor being enabled in response to and during the leading edges and the trailing edges of the switch control signal.

13. The driver circuit of claim 12 wherein the current circuit further comprises a second transistor having a control terminal coupled to the output of the monostable circuit, a first terminal coupled to the control terminal of the first transistor, and a second terminal coupled to a ground, the second transistor being structured to be disabled by the monostable circuit during the leading edges and the trailing edges of the switch control signal to enable the first transistor.

14. The driver circuit of claim 11 wherein the switching transistor comprises an N-channel MOS transistor having a drain terminal coupled to the load and a source terminal coupled to a ground.

* * * * *